United States Patent
Lee et al.

(10) Patent No.: US 7,529,649 B2
(45) Date of Patent: May 5, 2009

(54) SYSTEM AND METHOD FOR KNOWLEDGE BASED INTERIOR DEVELOPMENT

(75) Inventors: David J. Lee, Lynnwood, WA (US); Gregory J. Oakes, Duvall, WA (US); Gina C. Pischke, Everett, WA (US)

(73) Assignee: The Boeing Company, Chicago, IL (US)

( * ) Notice: Subject to any disclaimer, the term of this patent is extended or adjusted under 35 U.S.C. 154(b) by 595 days.

(21) Appl. No.: 10/802,921

(22) Filed: Mar. 18, 2004

(65) Prior Publication Data

US 2005/0209830 A1 Sep. 22, 2005

(51) Int. Cl.
G06F 17/50 (2006.01)
G06G 7/48 (2006.01)

(52) U.S. Cl. .............................. 703/1; 703/8
(58) Field of Classification Search ............... 703/1, 703/8

See application file for complete search history.

(56) References Cited

U.S. PATENT DOCUMENTS

| | | | | |
|---|---|---|---|---|
| 5,611,503 A | * | 3/1997 | Brauer | 244/118.6 |
| 6,113,644 A | * | 9/2000 | Weber et al. | 703/8 |
| 2002/0026296 A1 | * | 2/2002 | Lohmann et al. | 703/1 |
| 2002/0161563 A1 | * | 10/2002 | Elabiad et al. | 703/8 |
| 2003/0018454 A1 | * | 1/2003 | Winkler et al. | 703/1 |
| 2004/0010398 A1 | * | 1/2004 | Noma et al. | 703/1 |

* cited by examiner

*Primary Examiner*—Paul L Rodriguez
*Assistant Examiner*—Juan C Ochoa
(74) *Attorney, Agent, or Firm*—The Boeing Company; Clifford G. Cousins; John A. LePore

(57) ABSTRACT

A system and method for knowledge based development of interior models for configurable spaces, including passenger vehicles includes a database containing rules and parameters, a computer-aided design system, a user interface, and programmatic logic allowing aspects of the vehicle to be automatically changed upon a change initiated by a user, to maximize space and maintain compliance with the rules and parameters.

74 Claims, 10 Drawing Sheets

SYSTEM AND METHOD FOR KNOWLEDGE BASED INTERIOR DEVELOPMENT

FIELD OF THE INVENTION

The present invention relates generally to computer software. More particularly, the present invention relates to computer software for the configuration of configurable spaces.

BACKGROUND OF THE INVENTION

Interior design for configurable spaces, including passenger vehicles, such as airplanes, buses, subway and train cars, requires adherence to numerous standards and rules. For example, in the United States, the Federal Aviation Administration imposes restrictions on commercial airliners regarding the number of doors, distance between doors and seats or other landmarks, and width of aisles. Additionally, customers or users of the passenger vehicles submit their own requirements regarding distance between seats and other landmarks, in different classes of seating. In addition to specific rules, an overriding concern of manufacturers and purchasers of passenger vehicles is often the optimization of the available interior space to fit the most possible passengers, given the constraints of government, industry, and/or customer rules.

Current interior configuration modeling systems use a manually intensive process. Systems are able to model an interior using exact coordinates of each landmark, without regard for the location of each landmark relative to the other landmarks. This manually intensive process has trouble keeping pace with the rapid change in overall aircraft configuration. For example, if a person charged with the configuration of interiors of passenger vehicles (an "interior configurator") adds a landmark to the configuration, current interior configuration models are unable to shift seats or other landmarks in an efficient way, while also taking into account the constraints of rules imposed by governments, industry standards, and/or customers. Thus, the configurator would have to manually adjust the configuration of the interior to meet rules and standards.

Also, current interior configuration models do not automatically insure optimal seat and landmark locations, allowing for the largest number of seats possible under current constraints. Decisions made using current configuration models are based on limited arrangement data requiring an educated guess as to whether a configuration is optimized. Because the current tools require manual entry of coordinate data for landmarks and seats, the current tool requires constant regular use and a high level of expertise in order to be proficient at configuring and designing interiors. Finally, current tools allow for only manual extraction of internal configuration data, which is of limited utility for downstream processes such as assembly or maintenance.

Accordingly, it would be desirable to provide an interior development system for environments such as passenger vehicles that automatically morphs interiors to accommodate changes such as for example new lofts, door locations, and other feature changes. It would be further desirable to use a knowledge-based approach to automate the interior development process. Also, it would be desirable to store configuration data in a manner so that it is accessible to downstream users.

SUMMARY OF THE INVENTION

The foregoing needs are met, to a great extent, by the present invention, wherein in one aspect an apparatus is provided that in some embodiments provides an interior development system for environments such as passenger vehicles that automatically morphs interiors to accommodate changes such as for example new lofts, door locations, and other feature changes. Some embodiments use a knowledge-based approach to automate the interior development process and store configuration data in a manner so that it is accessible to downstream users.

In one embodiment of the present invention, a computer-implemented system for designing an interior section of a passenger vehicle to accommodate objects for the interior section of the passenger vehicle is disclosed. The system contains a database, which contains a digital definition of the interior section of the passenger vehicle and parameters related to the objects. The system also contains a computer-aided design system configured to display a visual model of the interior section of the passenger vehicle, a user interface capable of receiving user input from a user reflecting a first change to the interior section of the passenger vehicle, and a processor responsive to the user input by using the digital definition and the parameters to determine whether a second change to the interior section of the passenger vehicle is necessary because of the first change to the interior section of the passenger vehicle, and to execute the second change to the interior section of the passenger vehicle by updating the digital definition.

In another embodiment of the present invention, a computer-implemented method for designing an interior section of a passenger vehicle to accommodate objects for the interior section of the passenger vehicle is disclosed. The method comprises the steps of storing a digital definition of the interior section of the passenger vehicle and parameters related to the objects, displaying a visual model of the interior section of the passenger vehicle, receiving user input from a user reflecting a first change to the interior section of the passenger vehicle, determining in response to the user input and the digital definition and the parameters whether a second change to the interior section of the passenger vehicle is necessary because of the first change to the interior section of the passenger vehicle, and, executing the second change to the interior section of the passenger vehicle by updating the digital definition.

In a further embodiment of the present invention a computer-implemented system for designing an interior section of a passenger vehicle to accommodate objects for the interior section of the passenger vehicle, is disclosed. The system contains a means for storing a digital definition of the interior section of the passenger vehicle and parameters related to the objects, a means for displaying a visual model of the interior section of the passenger vehicle, a means for receiving user input from a user reflecting a first change to the interior section of the passenger vehicle, a means for determining in response to the user input and the digital definition whether a second change to the interior section of the passenger vehicle is necessary because of the first change to the interior section of the passenger vehicle, and, a means for executing the second change to the interior section of the passenger vehicle by updating the digital definition.

In a further embodiment of the present invention, a computer-readable medium comprising code capable of instructing a computer to perform a method for designing an interior section of a passenger vehicle to accommodate objects for the interior section of the passenger vehicle is disclosed. The method performed by the computer executing the code on the medium comprises the steps of, storing a digital definition of the interior section of the passenger vehicle and parameters related to the objects, displaying a visual model of the interior section of the passenger vehicle, receiving user input from a user reflecting a first change to the interior section of the passenger vehicle, determining in response to the user input and the digital definition and parameters whether a second change to the interior section of the passenger vehicle is necessary because of the first change to the interior section of the passenger vehicle, and, executing the second change to the interior section of the passenger vehicle by updating the digital definition.

Yet another embodiment of the present invention is disclosed as a computer-implemented system for designing a configurable space to accommodate objects for the interior section of the passenger vehicle. The system comprises a database comprising a digital definition of the configurable space and parameters related to the objects, a computer-aided design system configured to display a visual model of the configurable space, a user interface capable of receiving user input from a user reflecting a first change to the configurable space, and a processor responsive to the user input by using the digital definition and the parameters to determine whether a second change to the configurable space is necessary because of the first change to the configurable space, and to execute the second change to the configurable space by updating the digital definition.

In a further embodiment of the present invention, a computer-implemented method for designing a configurable space to accommodate objects for the configurable space is disclosed. The method comprises, storing a digital definition of the configurable space and parameters related to the objects, displaying a visual model of the configurable space, receiving user input from a user reflecting a first change to the configurable space, determining in response to the user input and the digital definition and the parameters whether a second change to the configurable space is necessary because of the first change to the configurable space, and, executing the second change to the configurable space by updating the digital definition.

In yet a further embodiment of the present invention, a computer-implemented system for designing a configurable space to accommodate objects for the configurable space is disclosed. The system comprises a means for storing a digital definition of the configurable space and parameters related to the objects, a means for displaying a visual model of the configurable space, a means for receiving user input from a user reflecting a first change to the configurable space, a means for determining in response to the user input and the digital definition whether a second change to the configurable space is necessary because of the first change to the configurable space, and, a means for executing the second change to the configurable space by updating the digital definition.

In yet another embodiment of the present invention, a computer-readable medium comprising code capable of instructing a computer to perform a method for designing a configurable space to accommodate objects for the configurable space is disclosed. The method performed by the computer executing the code on the medium comprises the steps of, storing a digital definition of the configurable space and parameters related to the objects, displaying a visual model of the configurable space, receiving user input from a user reflecting a first change to the configurable space, determining in response to the user input and the digital definition and parameters whether a second change to the configurable space is necessary because of the first change to the configurable space, and, executing the second change to the configurable space by updating the digital definition.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

An embodiment in accordance with the present invention provides a Knowledge Based Interior Development tool that enhances and automates the process for developing interior configurations. The tool enables configurators to easily and efficiently generate the large number of interior configurations required in the product development, sales, and customer introductions environment. Additionally, the data generated by the application provides the foundation for sharing configuration data among downstream users. A full-time link to a database is established to retrieve the required input parameters and then the configuration geometry and arrangement is generated in the Computer Aided Design system by the Knowledge Based Interior Development tool. Finally, the selected rule-set is saved back to the database for future reference. Specific data, such as seat and commodity locations, may also be stored in a database for future use by downstream users.

The Knowledge Based Interior Development tool enables the users to easily and efficiently access and share geometry and parameter data for the development of interior designs while consistently checking and assuring compliance with certification regulations. The Knowledge Based Interior Development tool establishes a number of new approaches to interior design. The system uses a rule based approach, which allows users to select configuration requirements, or rule sets, from a series of dialog boxes. The system saves the rule set, creates the geometry of the interior, and lays out the interior arrangement, at run time, when the rule sets are chosen and/or created. The system captures knowledge, rules, and parameters in a database, and can be retrieved on demand.

The interior is designed using a zonal approach, where every object in the system has a zone that defines the boundaries within which it can be placed. In a preferred embodiment, there are seven levels of zones from the Layout of Passenger Accommodation (LOPA) level, which represents the entire interior of the vehicle, to the monument level, which is a separate level for each individual monument, which can include galleys, lavatories and closets. Zones are not defined by their location, but by relation to the neighboring zones and features of the vehicle. Each zone shares boundary information with the neighboring zones and becomes the component of the parent level zone. The Knowledge Based Interior Development tool uses a database approach, whereby a full time link is established to a database holding the required parameters. The system can access the database to output the configuration rule set, the static geometry, and location data which can be accessed and utilized by downstream systems.

Figure 1:
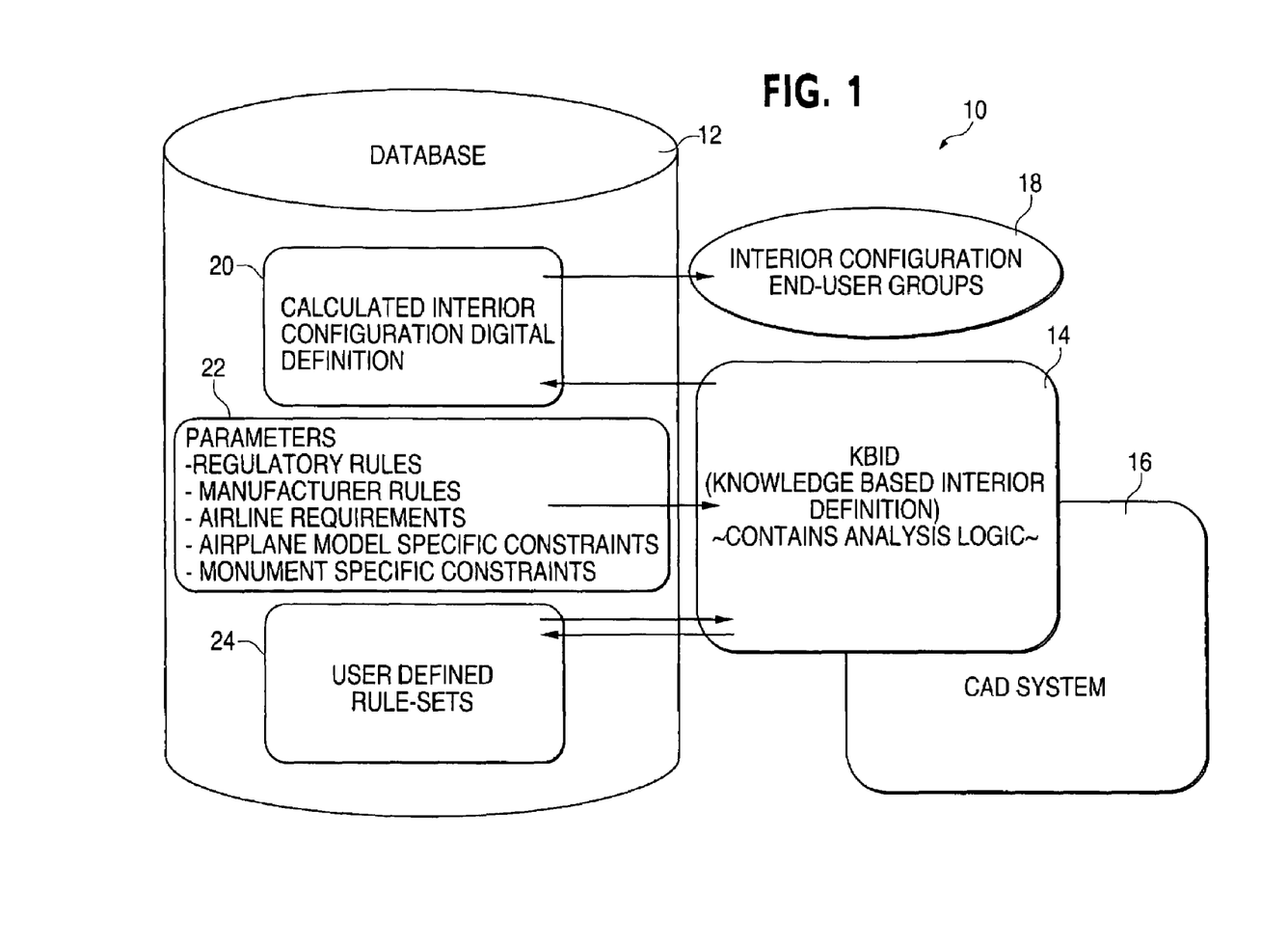
FIG. 1 is a diagram illustrating a system architecture according to a preferred embodiment of the invention.

The invention will now be described with reference to the drawing figures, in which like reference numerals refer to like parts throughout. An embodiment of the present inventive system and method is illustrated in FIG. 1, which illustrates the overall architecture of a system 10. The system 10 contains a database 12, Knowledge Based Interior Definition analysis logic 14, a Computer Aided Design (CAD) system 16, and a User Interface 18. The database 12 is stored on a computer-readable storage media, such as a hard disk drive. The analysis logic 14, CAD system 16, and user interface 18 are also stored on storage media. In a preferred embodiment, the analysis logic 14, CAD system 16 and user interface 18 are all stored on the same storage medium as each other, but a different storage medium than the database 12.

The database 12 contains calculated interior configuration digital definitions 20, parameters 22, and user-defined rule-sets 24. The parameters 22 include fixed rules that are applicable to all vehicles, or all vehicles of a particular type. These include governmental rules, industry standards, manufacturer standards, customer standards, and/or constraints based on the specific model of vehicle, or based on any specific monument to be placed within that vehicle. The system contains links so that its parts can obtain information from each other. There is a link between the Calculated Interior Configuration Digital Definition 20 and the User Interface 18, so that the user can save the configuration in database format. In a preferred embodiment, the configuration is not saved as a CAD file, in CAD format. This format would store only the coordinate location of each object in the vehicle. Instead, the configuration is saved in the database 12, and contains the rules, parameters, and other settings that are used to create the layout. However, the parameter information in the database 12 can be exported in its native format or in a format usable by other CAD systems, for use in downstream applications such as later redesign, retrofitting, or repair.

There is a link between the analysis logic 14 and the Calculated Interior Configuration Digital Definition 20. The system uses this link so that the analysis logic can save changes to layout plans in the database format discussed above. There is also a link between the parameters 22 and the analysis logic 14. The analysis logic 14 has access to the parameters 22 stored in the database 12, so that the analysis logic 14 can apply the constraints contained in the parameters. The analysis logic 14 applies the parameters 22 to create a layout of an interior, as will be described below. The analysis logic 14 and the user-defined rule-sets 24 have links with each other in both directions. This allows the analysis logic to take rule sets created by the user and save them in the database 12 so that they can be fully accessed during a later process, and also allows the analysis logic to extract user-defined rule sets and apply them to a current layout process. The analysis logic 14 is also layered on top of the CAD system 16. This allows the analysis logic 14 to create a CAD drawing of the layout, so that it can be viewed by the user in visual form, and viewed later by other users using different CAD systems.

Figure 2:
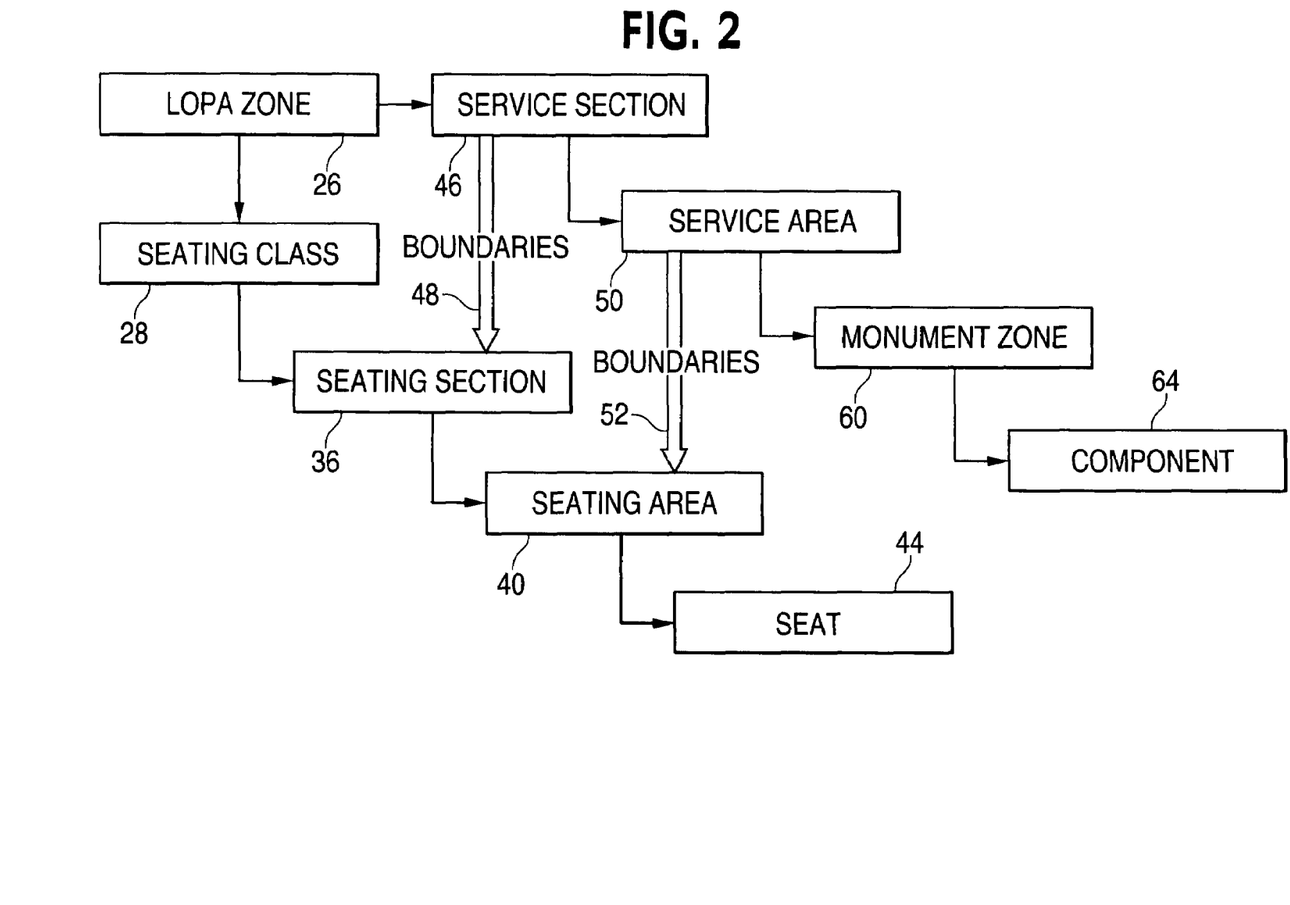
FIG. 2 is a chart illustrating levels of zones according to a preferred embodiment of the present invention.
Figure 3A:
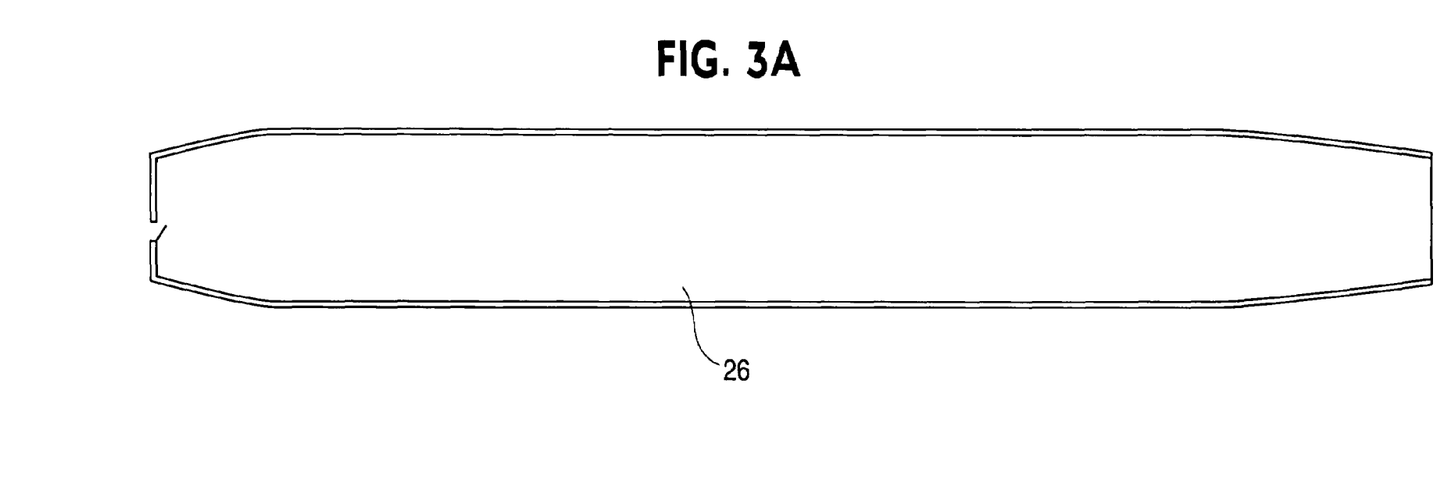
FIGS. 3A, 3B, 3C, 3D, 3E, 3F and 3G are illustrations of different portions of vehicles as used in an embodiment of the present invention.

Turning now to FIG. 2, a hierarchical diagram of zones is shown. The system according to a preferred embodiment of the present invention divides the vehicle into a number of zones. The zones are arranged in a hierarchy wherein each zone represents a smaller portion of the vehicle, and there can be one or more smaller zone inside a larger zone. FIGS. 3A-3G show examples of each zone. FIGS. 3A-3G demonstrate the zones in the context of a passenger airplane, but it should be understood by one of ordinary skill in the art that these zones are applicable to any mass transit passenger vehicle. The first zone is the Layout of Passenger Accommodation (LOPA) zone 26, which is shown in FIG. 3A. The LOPA zone is the entire passenger section of the airplane, and is bounded by the forward and aft bulkheads. All of the smaller zones are components of the LOPA zone, as will be shown in the figures below.

Figure 3B:
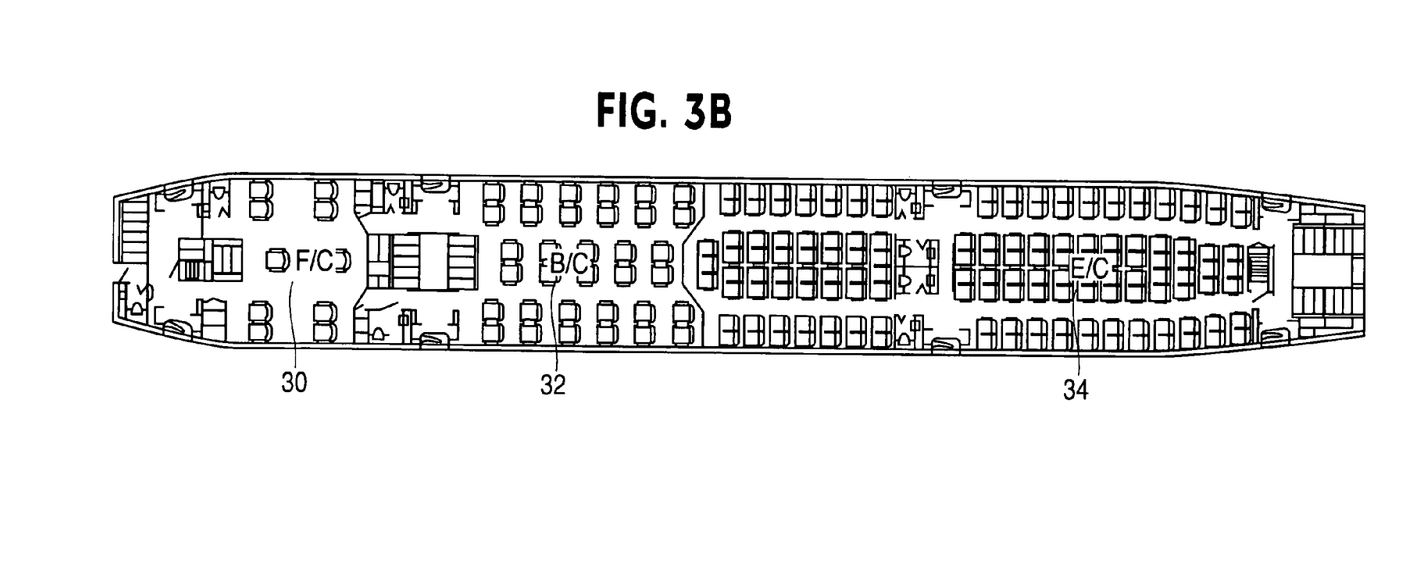

The LOPA zone contains multiple zones that can be of two types. One type is the seating class zone 28. As shown in FIG. 3B, the LOPA zone can be divided into one or more seat class zones. Examples of seat class zones are First Class 30, Business Class 32, and Economy Class 34. It should be understood by one of ordinary skill in the art that other seat classes can be used, including premium, economy, and tourist classes. Additionally, it should be understood that some passenger vehicles may have only one seat class zone which can be commensurate in size with the LOPA zone. Having a passenger vehicle divided into seat class zones allows the configurator or other creators of rules to implement different rules in each seat class zone of the vehicle. Examples of rules that differ between seat class zones would be the width of the seats, the distance from the front to the back of the seat, the distance between the back of one seat to the front of another (e.g. the "legroom"), the amount by which the chairs are permitted to recline, and the width of aisles.

Figure 3C:
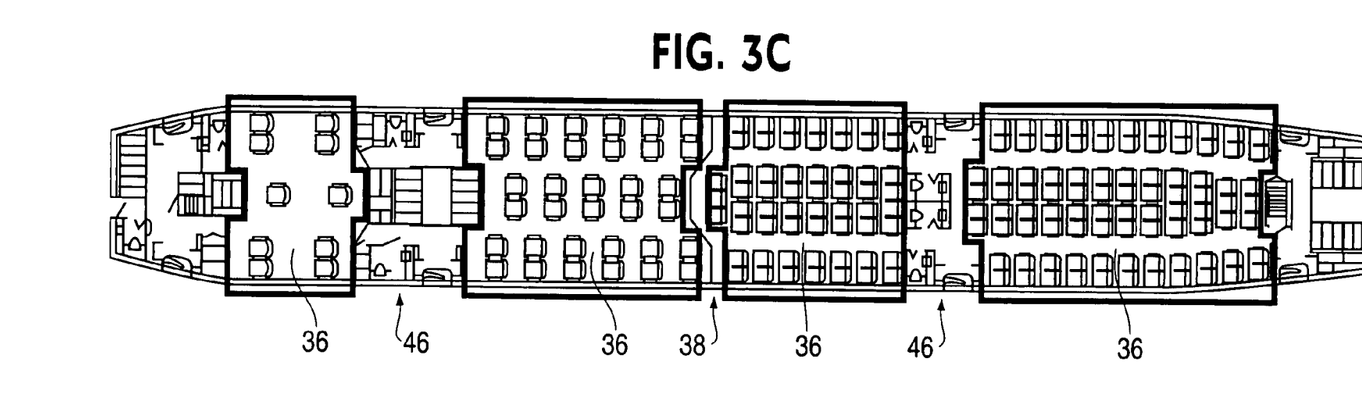

The next zone in the seating branch of the hierarchy is the seating section zone 36, which is depicted in FIG. 3C. The boundaries of these seating section zones are established at each door break 38 within the class zone. By dividing the class zone into seating section zones, configurators can have different rules for different segments of the plane based on the location of the doors 38. Customers or regulatory bodies may have different requirements for seating or other monuments, depending on the side of a given door on which they are located. Creating separate zones for each door-to-door (or door to end-of-plane) segment allows configurators to implement different rules for each segment.

Figure 3D:
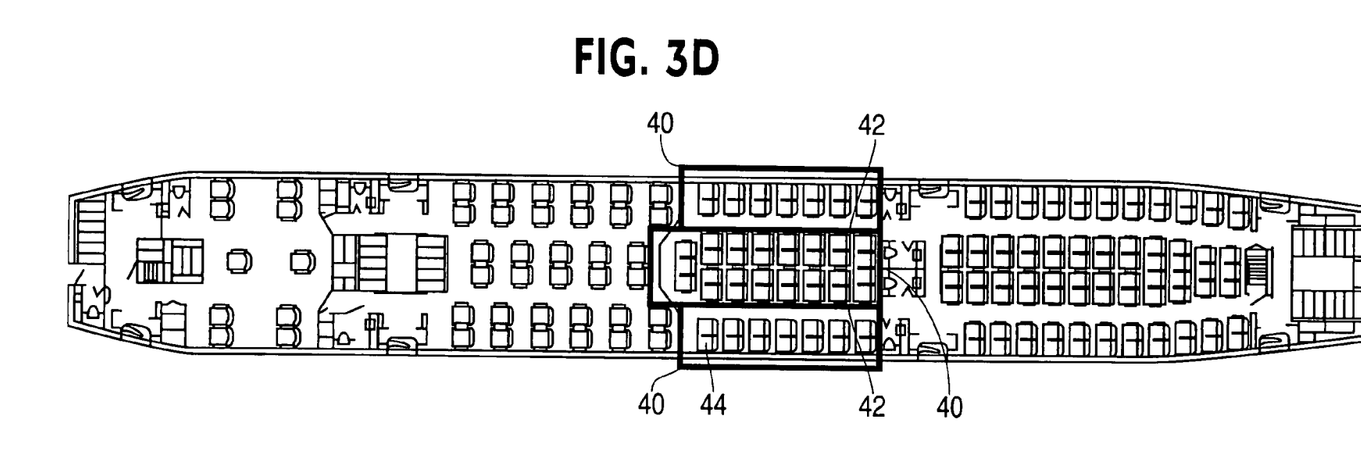

One level lower in the seating branch of the zone hierarchy is seating area zone 40, as illustrated in FIG. 3D. The seating area zones are bounded laterally at each horizontal aisle 42. Having each lateral row of seats, bounded by aisles or the sides of the plane, allows separate rules to be created for each seating area zone. Once a width for a lateral zone has been established, the configurator can experiment with seat configurations, within the rules, to achieve maximum space utilization. The configuration of the seats needed to achieve maximum space utilization may be different on one side or the other or different rules may apply to center rows than apply to side rows. Adding the flexibility to create different configurations based on lateral zone gives configurators the ability to better utilize space. Additionally, the configurator has the option of configuring each individual seat 44.

Figure 3E:
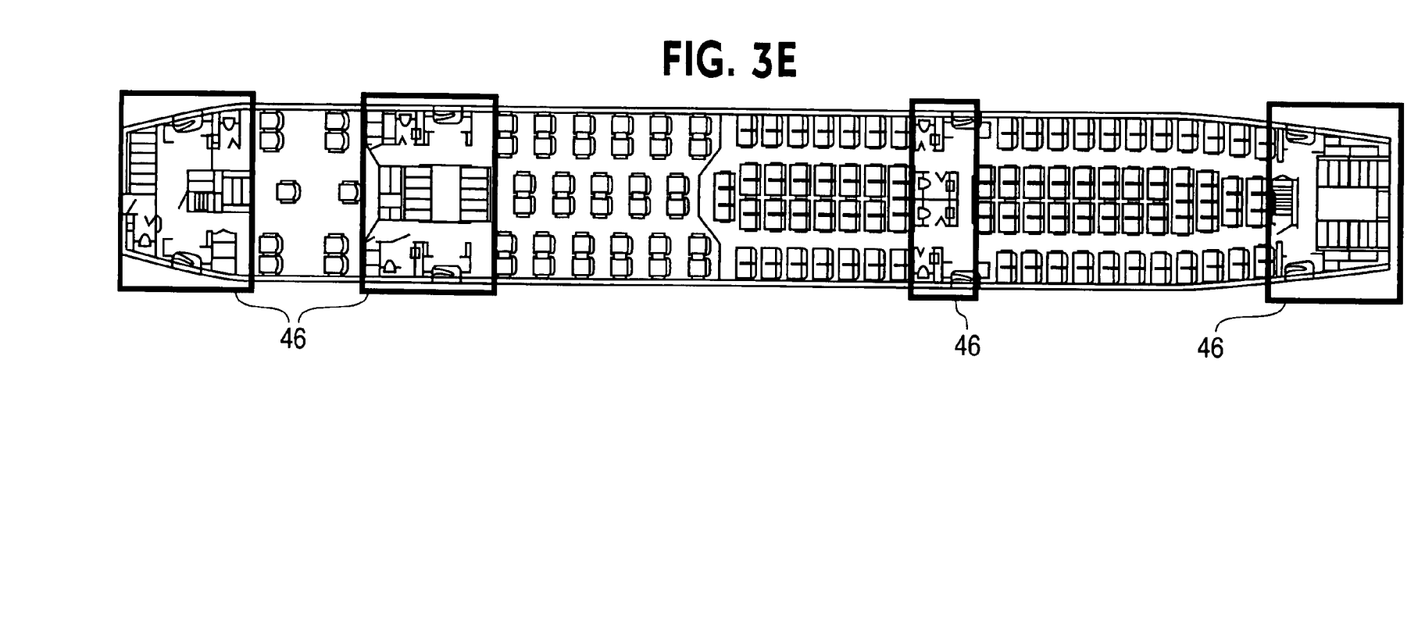

In addition to seating class zones 28, the LOPA zone can also contain one or more service section zones 46, as shown in FIG. 3E. Service section zones are bounded on one or both sides by seating section zones, as depicted by the boundaries 48. Service section zones are those areas of the vehicle where service monuments are stored. Service monuments include galleys (or kitchens), lavatories, and closets. Having a zone for the commodity section as a whole, in addition to smaller zones therein (described below) allows the configurator to adjust the size of the zone as a whole, in relation to the seating sections, without regard to which particular type of commodity is contained within the zone. Also, regulatory bodies and/or customers may have rules regarding commodity zones generally, which can more easily be applied with this more generic zone.

Figure 3F:
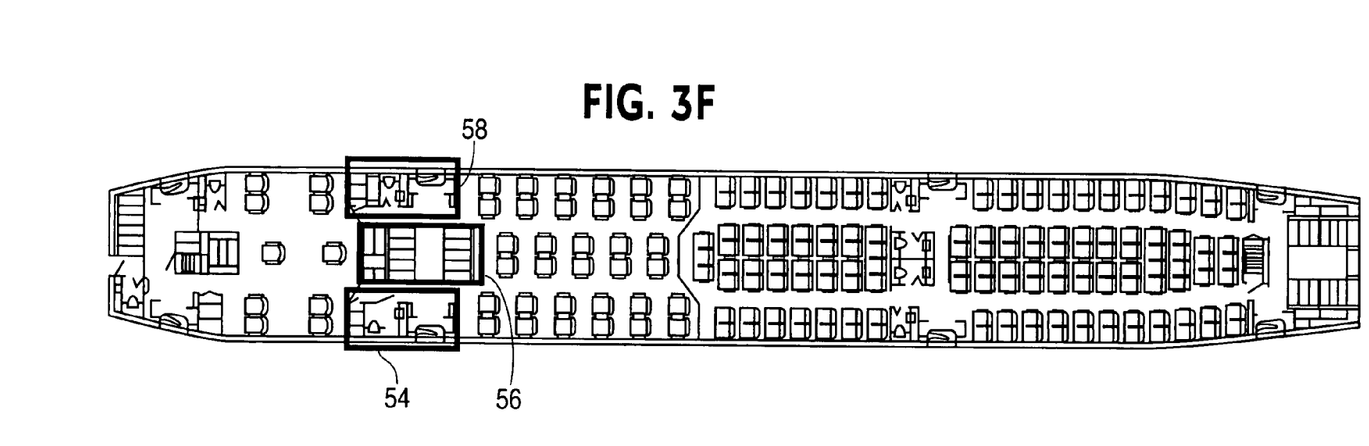

The next zone in the service branch of the zone hierarchy is the service area zone 50, as depicted in FIG. 3F. Much like seating area zones 40, service area zones 50 are separated by aisles. As depicted with the boundaries 52, service area zones 50 are bounded by seating area zones 40. As shown in FIG. 3F, the preferred embodiment uses three service area zones 50 for each service section zone 46: a left service area 54, a center service area 56, and a right service area 58.

Figure 3G:
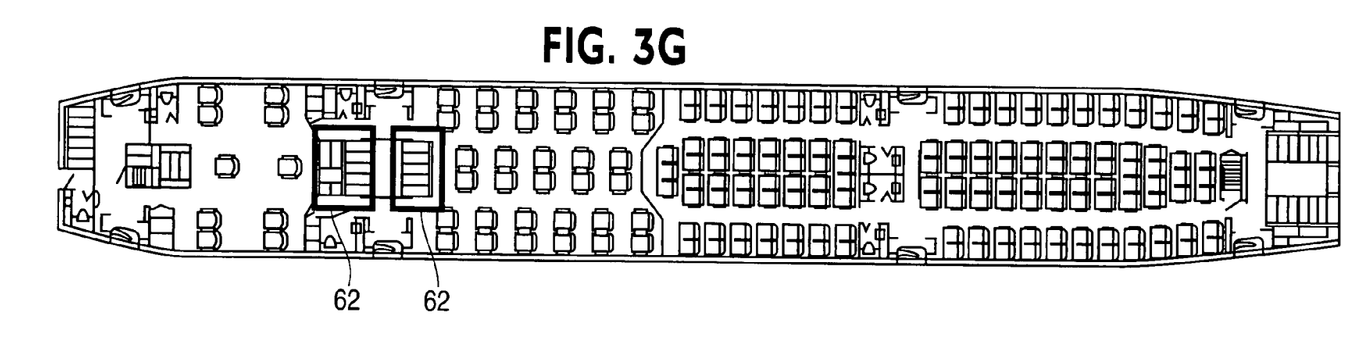

One level lower in the service branch of the zone hierarchy is the monument zone 60, as illustrated in FIG. 3G. The monument zone 60 is defined by the boundaries of each individual monument, such as a lavatory, a galley, or a closet 62. Regulatory agencies or customers could impose rules that a lavatory or galley must have a minimum area, or length or width, or that a galley must, for safety reasons, be surrounded by a certain amount of unused space. These details can be handled with rules that affect the individual monument zones. Additionally, a configurator can add or configure individual components 64 within a particular monument zone.

Because the system uses the zonal approach, a configurator is able to impose rules that affect the entire vehicle, or different portions of the vehicle based on the zone of the portion the configurator would like to change. Some rules have wide-ranging applicability, applying to the entire LOPA zone, including regulations regarding the width of cross-aisles or the number of lavatories. Other decisions will be based on the class of service, including the dimensions of the seats, and the distance separating them. Still other decisions may be based on the cabin zone within a class, including exit-row requirements. Some decisions can apply on a lateral level, including the number of seats in a row. Certain decisions, like the distance between a commodity and a seat, will be governed at the commodity section level. Finally, other decisions may be based on the individual component itself, such as the layout of the inside of a lavatory. The ability to apply these rules at these different levels further automates the design process.

Figure 4:
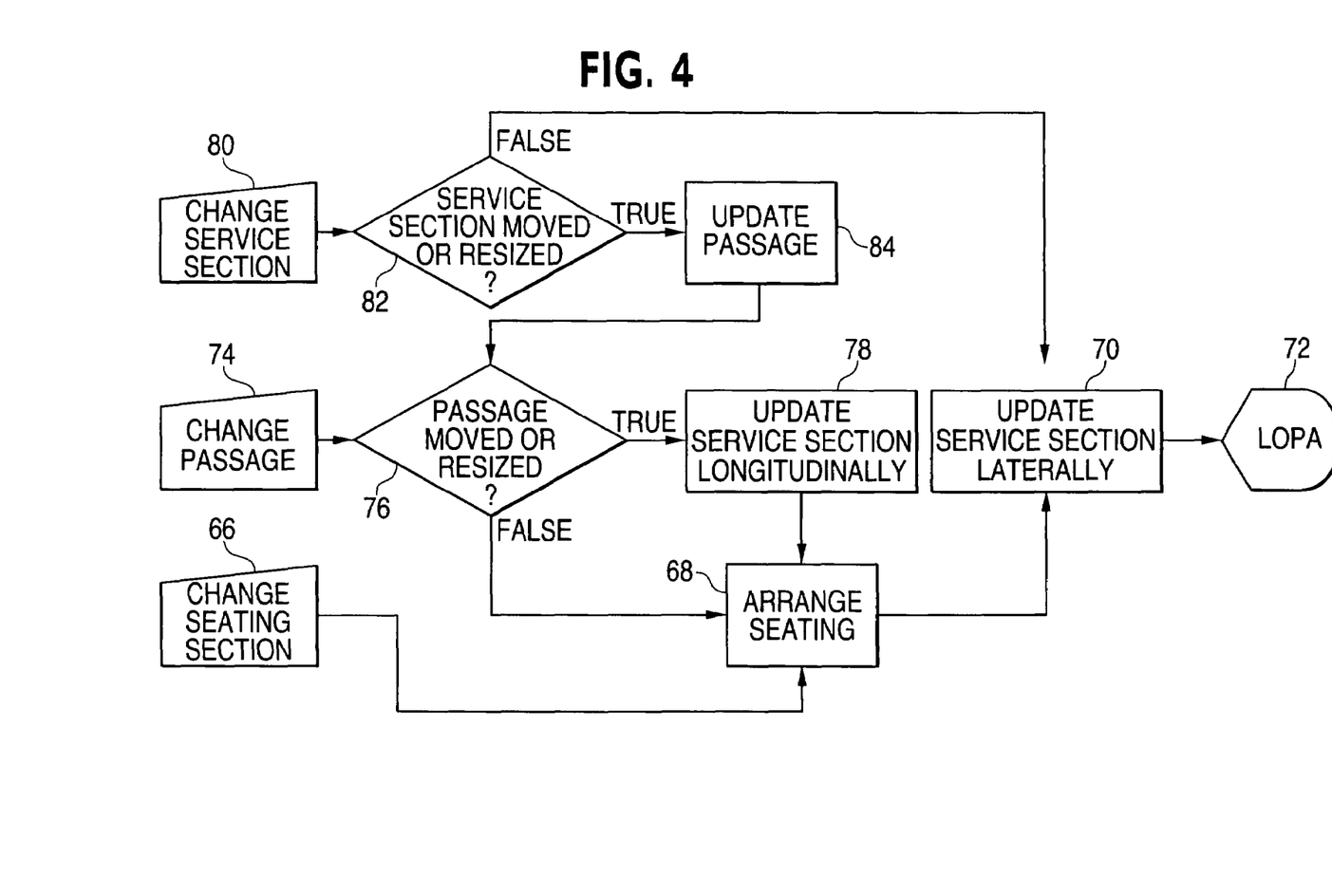
FIG. 4 is a flow chart of the programmatic logic used in an embodiment of the present invention.

Turning now to FIG. 4, the iteration flow logic of a preferred embodiment of the present invention is shown. The configurator, when interacting with the user interface of the system, is given a number of options to change the layout of the vehicle, by changing rules for different zones, or for individual seats or rows of seats. In a preferred embodiment, there are three major categories of change that can be made to a layout by a configurator.

One change a configurator can make to the layout of a vehicle is to change a seating section 66. The configurator can change a seating section by changing any of the properties of seats in that section. For example, the configurator can change the width of the seats in a given section, the pitch of the seats in a given section, or the recline distance of all seats in a given section. It should be noted that these global changes can be made in the seat class model zone, the cabin segment zone, or the lateral zone, allowing the configurator to change the seat dimensions for larger or smaller groups of seats. Additionally, the configurator can change a single row of seats, or a single seat. For instance, in a preferred embodiment, the configurator can ask the system how an extra row of seats can be added to the configuration. The system may inform the user that, if the user reduces the reclining distance of one row by a certain number of inches, an additional row of seats can be added. The configurator's decision to make that individual change triggers the "Change Seating Section" logic 66.

Once the configurator has decided to change a seating section, the software executes the portion of the code that arranges the seating 68. This code is able to rearrange the seating area to take the change into account. The code in this section implements the change specified by the user, and then updates the remainder of the seating section to take that change into account. Because all of the components are interrelated through zones and awareness of boundaries, the update is completed automatically. Following the example above, if the configurator reduces the recline distance of the seats in the last row by one inch, enough space may be freed up behind that row to insert another row of seats. The system knows this because the code is programmed to insert rows of seats behind other rows of seats if another monument (or the aft bulkhead) is not in the way. Thus, by changing the attributes of one row of seats, another row of seats is added automatically.

After the seating has been arranged to reflect the configurator's change, control is passed to the section of code responsible for the function of Updating the Service Section Laterally 70. Here, the software checks if a lavatory or a galley (i.e. a "service area") may be able to be expanded as a result of an update initiated by the user. If a lavatory or galley is preexisting, and no seats can be added, the system may expand the existing service area rather than leave the space adjacent to it unused. After these updates are made, the LOPA is regenerated, with new coordinate data being passed calculated and passed to the CAD system, and the LOPA is redrawn 72.

A configurator can also decide to make a change to a passage 74. A passage is an empty space where people or equipment can travel, including a passageway or a cross-aisle. A cross-aisle is an aisle of lateral orientation, and usually exists near the doors of the vehicle. In the case of passenger airplanes regulated by the United States Federal Aviation Administration, every pair of doors must be accompanied by a cross-aisle of at least 20 inches in width. Manufacturers or customers may have requirements of wider cross-aisles. Also, there may be a requirement that a cross-aisle be wider if it is bordered on either side by a galley or a lavatory. Subject to these constraints, however, a configurator has some leeway in locating passages within the vehicle.

If a passage is changed, the software determines whether the passage has been moved or resized 76. If the passage has not been moved or resized, but has changed in some other way, the software passes control to the seating arrangement code 68. As described above, this code rearranges the seating based on the change made to the configuration—in this case the change to the passage. When the seating has been rearranged, the code passes control to the code used to update service section laterally 70. As described above, this updates a service section based on any seating change, and also based on the passage change. When this update is completed, control is passed to the LOPA reconfiguration code 72, which recalculates all of the coordinate data and redraws the LOPA. The code then returns.

If the passage has been moved or resized, control is passed to the code for updating a service section longitudinally 78. This code is responsible for checking if a service section—a galley or a lavatory—needs to be updated as a result of the moving or resizing of a passage. Because the data representing the service section has links to the data representing the passage, and knows where its boundaries are, the code is able to determine if a service section is affected by a change in a passage. For example, if a configurator decides to expand a cross-aisle beyond the required distance, a galley bordering that cross-aisle may need to be moved forward or backward, depending on the direction of the change in the cross-aisle.

After the service sections bordering or otherwise affected by the moved or resized passage have been updated 78, control is passed to the code for arranging seating 68. As described above, this code rearranges the seating based on the change made to the configuration—in this case the change to the passage. When the seating has been rearranged, the code passes control to the code used to update service section laterally 70. As described above, this updates a service section based on any seating change, and also based on the passage change. When this update is completed, control is passed to the LOPA reconfiguration code 72, which recalculates all of the coordinate data and redraws the LOPA. The code then returns.

In addition to changing seating sections or passages, a configurator can also be presented with the option of changing a service section itself 80. As noted above, a service section is usually either a galley or a lavatory, though a closet or any other monument can also be considered a service section. When the configurator has changed a service section, the code checks if the service station has been moved or resized 82. One way to change a service station without moving or resizing it is to re-arrange the items inside it. For example, the orientation of a commode or a sink within a lavatory can be changed without moving or resizing the lavatory itself. If the service section has not been moved or resized, the system passes control to the code responsible for updating the service section laterally 70. When this update is completed, control is passed to, the LOPA reconfiguration code 72, which recalculates all of the coordinate data and redraws the LOPA. The code then returns.

If the service section has been moved or resized, the system passes control to the section of code responsible for updating a passage in response to the change in the service section 84. For example, if a galley is added to the LOPA adjacent to a cross aisle, the cross-aisle must be extended to comply with safety regulations or customer rules requiring wider cross-aisles if they are bordered by a galley. This code updates the data for the passage that needs to be changed as a result of the change to, or addition or deletion of, a service section.

After updating the passage, the system asks if the update to the passage was a move or a resize, or whether it was some other type of update 76. As described above, if the passage has not been moved or resized, the seating may need to be arranged 68, which may result in a need to update a service section laterally 70. When this update is completed, control is passed to the LOPA reconfiguration code 72, which recalculates all of the coordinate data and redraws the LOPA. The code then returns. If the passage has been moved or resized, this triggers a longitudinal update to a service section 78, which may be another service section affected by the original change to a service station. After this has completed, control is passed to the code for arranging seating 68, which passes control to the code for updating a service section laterally 70. When this update is completed, control is passed to the LOPA reconfiguration code 72, which recalculates all of the coordinate data and redraws the LOPA. The code then returns.

Because of the automated nature of the system, updates can be concluded in a much shorter amount of time than was previously possible. This allows for live configuration during a demonstration to a customer, which was impractical with longer configuration times.

Although an example of the system is shown using a particular set of zones, it will be appreciated that other zones can be used as appropriate to the type of vehicle being configured. Also, although the system is useful to configure the interior of passenger aircraft it can also be used to configure the interior of other passenger vehicles, including commuter or long-distance railcars, subway cars, and busses, and other configurable spaces such as auditoriums or stadiums.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A computer-implemented system for designing an interior section of a passenger vehicle to accommodate objects for the interior section of the passenger vehicle, comprising
   a database comprising a digital definition of the interior section of the passenger vehicle and parameters related to the objects;
   a computer-aided design system configured to display a visual model of the interior section of the passenger vehicle;
   a user interface capable of receiving user input from a user reflecting a first change to the interior section of the passenger vehicle;
   a processor responsive to the user input by using said digital definition and said parameters to determine automatically whether a second change to the interior section of the passenger vehicle is necessary because of the first change to the interior section of the passenger vehicle, and execute automatically the second change to the interior section of the passenger vehicle by updating said digital definition and execute automatically changes to the entire interior section by updating said digital definition based on the other changes in the interior section; and
   a means for zones being arranged in a hierarchy wherein each zone represents a smaller portion of the vehicle, and there is at least one or more smaller zones inside a larger zone.

2. The system of claim 1, wherein said digital definition comprises a plurality of data objects representing different aspects of the interior.

3. The system of claim 2, wherein a first one of said data object contains information regarding a second data object representing an aspect of the interior that has a relationship with an aspect of the interior represented by said first data object.

4. The system of claim 3, wherein said processor is capable of modifying said second data object in response to a change made by the system to said first data object, and said processor uses said information regarding said second data object to determine whether said second data object should be modified.

5. The system of claim 2, wherein each of said data objects has one of a plurality of types, and a first of said types represents a first portion of the vehicle that is fully contained within a second portion of the vehicle represented by a second of said types.

6. The system of claim 5, wherein said processor is capable of responding to a change to a data object having said first type and said processor is capable of responding to a change to a data object having said second type.

7. The system of claim 1, further comprising a means for exporting a portion of the contents of said database in a format that can be used with a computer-aided design system different from said computer aided design system of said system.

8. The system of claim 1, further comprising a means for determining the maximum number of seats that can fit in a section of the interior, based on said parameters and the location of other objects in the interior.

9. The system of claim 1, further comprising a means for determining a course of action that, if taken, will allow the addition of one extra row of seats, while maintaining compliance with said parameters.

10. The system of claim 1, further comprised of the passenger vehicle being an airplane.

11. The system of claim 7, further comprising saving the relationship of other objects including seats and other objects including monuments in the database.

12. The system of claim 7, further comprising an object placing sequence including every object in the system having a zone that defines the boundaries within which it can be placed, accommodating full automation.

13. The system of claim 1, further comprising fully automating the arranging of interior objects while checking clearances and certification requirements for the entire interior whenever a change is made.

14. The system of claim 1, comprising the processor determining automatically all the changes to the interior at the same time according to the means for zones being hierarchically arranged.

15. A computer-implemented method for designing an interior section of a passenger vehicle to accommodate objects for the interior section of the passenger vehicle, comprising
storing a digital definition of the interior section of the passenger vehicle and parameters related to the objects;
displaying a visual model of the interior section of the passenger vehicle;
receiving user input from a user reflecting a first change to the interior section of the passenger vehicle;
determining in response to the user input and said digital definition and said parameters whether a second change to the interior section of the passenger vehicle is necessary because of the first change to the interior section of the passenger vehicle; and
executing the second change to the interior section of the passenger vehicle by updating said digital definition
fully automating the arranging of interior section of the passenger vehicle while checking clearances and certification requirements for the entire interior whenever a change is made.

16. The method of claim 15, wherein said digital definition comprises a plurality of data objects representing different aspects of the interior, an object placing sequence including every object in the system having a zone that defines the boundaries within which it can be placed, accommodating full automation.

17. The method of claim 16, wherein a first one of said data objects contains information regarding a second data object representing an aspect of the interior that has a relationship with an aspect of the interior represented by said first data object.

18. The method of claim 17, further comprising the steps of modifying said second data object in response to a change made to said first data object, and using said information regarding said second data object to determine whether said second data object should be modified.

19. The method of claim 16, wherein each of said data objects has one of a plurality of types, and a first of said types represents a first portion of the vehicle that is fully contained within a second portion of the vehicle represented by a second of said types.

20. The method of claim 15, further comprising the step of exporting a portion of said digital definition in a format that can be used with a computer-aided design system.

21. The method of claim 15, further comprising the step of determining the maximum number of seats that can fit in a section of the interior, based on said parameters and the location of other objects in the interior.

22. The method of claim 15, further comprising the step of determining a course of action that, if taken, will allow the addition of one extra row of seats, while maintaining compliance with said parameters.

23. A computer-implemented system for designing an interior section of a passenger vehicle to accommodate objects for the interior section of the passenger vehicle, comprising
means for storing a digital definition of the interior section of the passenger vehicle and parameters related to the objects;
means for displaying a visual model of the interior section of the passenger vehicle;
means for receiving user input from a user reflecting a first change to the interior section of the passenger vehicle;
means for determining in response to the user input and said digital definition whether a second change to the interior section of the passenger vehicle is necessary because of the first change to the interior section of the passenger vehicle;
means for executing the second change to the interior section of the passenger vehicle by updating said digital definition; and
a means for zones being arranged in a hierarchy wherein each zone represents a smaller portion of the vehicle, and there is at least one or more smaller zones inside a larger zone.

24. The system of claim 23, wherein said digital definition comprises a plurality of data objects representing different aspects of the interior.

25. The system of claim 24, wherein a first one of said data objects contains information regarding a second data object representing an aspect of the interior that has a relationship with an aspect of the interior represented by said first data object.

26. The system of claim 25, wherein said means for determining is capable of modifying said second data object in response to a change made by the system to said first data object, and said means for determining uses said information regarding said second data object to determine whether said second data object should be modified.

27. The system of claim 24, wherein each of said data objects has one of a plurality of types, and a first of said types represents a first portion of the vehicle that is fully contained within a second portion of the vehicle represented by a second of said types.

28. The system of claim 27, wherein said means for determining is capable of responding to a change to a data object having said first type and said means for determining is capable of responding to a change to a data object having said second type.

29. The system of claim 23, further comprising a means for exporting a portion of the contents of said digital definition in a format that can be used by a means for displaying different from said means for displaying of said system.

30. The system of claim 23, further comprising a means for determining the maximum number of seats that can fit in a section of the interior, based on said parameters and the location of other objects in the interior.

31. The system of claim 23, further comprising a means for determining a course of action that, if taken, will allow the addition of one extra row of seats, while maintaining compliance with said parameters.

32. A computer-readable medium having computer-executable instructions for performing a method for designing an interior section of a passenger vehicle to accommodate objects for the interior section of the passenger vehicle for manufacture of the passenger vehicle, said method comprising the steps of:
    storing a digital definition of the interior section of the passenger vehicle and parameters related to the objects;
    displaying a visual model of the interior section of the passenger vehicle;
    receiving user input from a user reflecting a first change to the interior section of the passenger vehicle;
    determining in response to the user input and said digital definition and parameters whether a second change to the interior section of the passenger vehicle is necessary because of the first change to the interior section of the passenger vehicle; and
    executing the second change to the interior section of the passenger vehicle by updating said digital definition for manufacture of the passenger vehicle; and
    fully automating the arranging of all digital definitions of the interior objects in the interior section while checking clearances and certification requirements for the entire interior whenever a change is made, and zones being arranged in a hierarchy wherein each zone represents a smaller portion of the vehicle, and there is at least one or more smaller zones inside a larger zone.

33. The computer-readable medium of claim 32, wherein said digital definition comprises a plurality of data objects representing different aspects of the interior, an object placing sequence including every object in the system having a zone that defines the boundaries within which it can be placed, accommodating full automation.

34. The computer-readable medium of claim 33, wherein a first one of said data objects contains information regarding a second data object representing an aspect of the interior that has a relationship with an aspect of the interior represented by said first data object.

35. The computer-readable medium of claim 34, wherein said method further comprises the steps of modifying said second data object in response to a change made to said first data object, and using said information regarding said second data object to determine whether said second data object should be modified.

36. The computer-readable medium of claim 33, wherein each of said data objects has one of a plurality of types, and a first of said types represents a first portion of the vehicle that is fully contained within a second portion of the vehicle represented by a second of said types.

37. The computer-readable medium of claim 32, wherein said method further comprises the step of exporting a portion of said digital definition in a format that can be used by a computer-aided design system.

38. The computer-readable medium of claim 32, wherein said method further comprises the step of determining the maximum number of seats that can fit in a section of the interior, based on said parameters and the location of other objects in the interior.

39. The computer-readable medium of claim 32, wherein said method further comprises the step of determining a course of action that, if taken, will allow the addition of one extra row of seats, while maintaining compliance with said parameters.

40. A computer-implemented system for designing a configurable space to accommodate objects for the interior section of the passenger vehicle, comprising
    a database comprising a digital definition of the configurable space and parameters related to the objects;
    a computer-aided design system configured to display a visual model of the configurable space;
    a user interface capable of receiving user input from a user reflecting a first change to the configurable space;
    a processor responsive to the user input by using said digital definition and said parameters to determine automatically whether a second change to the configurable space is necessary because of the first change to the configurable space, and execute automatically the second change to the configurable space by updating said digital definition; and
    a means for zones being arranged in a hierarchy wherein each zone represents a smaller portion of the vehicle, and there is at least one or more smaller zones inside a larger zone, and fully automating the arranging of interior objects while checking clearances and certification requirements for the entire interior whenever a change is made.

41. The system of claim 40, wherein said digital definition comprises a plurality of data objects representing different aspects of the configurable space, an object placing sequence including every object in the system having a zone that defines the boundaries within which it can be placed, accommodating full automation.

42. The system of claim 41, wherein a first one of said data objects contains information regarding a second data object representing an aspect of the configurable space that has a relationship with an aspect of the configurable space represented by said first data object.

43. The system of claim 42, wherein said processor is capable of modifying said second data object in response to a change made by the system to said first data object, and said processor uses said information regarding said second data object to determine whether said second data object should be modified.

44. The system of claim 41, wherein each of said data objects has one of a plurality of types, and a first of said types represents a first portion of the configurable space that is fully contained within a second portion of the configurable space represented by a second of said types.

45. The system of claim 44, wherein said processor is capable of responding to a change to a data object having said first type and said processor is capable of responding to a change to a data object having said second type.

46. The system of claim 40, further comprising a means for exporting a portion of the contents of said database in a fonnat that can be used by a computer-aided design system different from said computer aided design system of said system.

47. The system of claim 40, further comprising a means for determining the maximum number of seats that can fit in a section of the configurable space, based on said parameters and the location of other objects in the configurable space.

48. The system of claim 40, further comprising a means for determining a course of action that, if taken, will allow the addition of one extra row of seats, while maintaining compliance with said parameters.

49. A computer-implemented method for designing a configurable space to accommodate objects for the configurable space, comprising
    storing a digital definition of the configurable space and parameters related to the objects;
    displaying a visual model of the configurable space;
    receiving user input from a user reflecting a first change to the configurable space;
    determining in response to the user input and said digital definition and said parameters whether a second change to the configurable space is necessary because of the first change to the configurable space;
    executing the second change to the configurable space by updating said digital definition;
    arranging the digital definitions into zones and the zones being arranged in a hierarchy wherein each zone represents a smaller portion of the vehicle, and there is at least one or more smaller zones inside a larger zone, and fully automating the arranging of interior objects while checking clearances and certification requirements for the entire interior whenever a change is made.

50. The method of claim 49, wherein said digital definition comprises a plurality of data objects representing different aspects of the configurable spaced an object placing sequence including every object in the system having a zone that defines the boundaries within which it can be placed, accommodating full automation.

51. The method of claim 50, wherein a first one of said data objects contains information regarding a second data object representing an aspect of the configurable space that has a relationship with an aspect of the configurable space represented by said first data object.

52. The method of claim 51, further comprising the steps of modifying said second data object in response to a change made to said first data object, and using said information regarding said second data object to determine whether said second data object should be modified.

53. The method of claim 50, wherein each of said data objects has one of a plurality of types, and a first of said types represents a first portion of the configurable space that is fully contained within a second portion of the configurable space represented by a second of said types.

54. The method of claim 49, further comprising the step of exporting a portion of said digital definition in a format that can be used by a computer-aided desigu system.

55. The method of claim 49, further comprising the step of determining the maximum number of seats that can fit in a section of the configurable space, based on said parameters and the location of other objects in the configurable space.

56. The method of claim 49, further comprising the step of determining a course of action that, if taken, will allow the addition of one extra row of seats, while maintaining compliance with said parameters.

57. The method of claim 49, further comprising a plurality of additional changes to the configurable space updating said digital definition in order to account for affect of each change in the configurable space on all others, wherein all changes to the configurable space using the zones are determined at the same time.

58. A computer-implemented system for designing a configurable space to accommodate objects for the configurable space, comprising
    means for storing a digital definition of the configurable space and parameters related to the objects;
    means for displaying a visual model of the configurable space;
    means for receiving user input from a user reflecting a first change to the configurable space;
    means for determining in response to the user input and said digital definition whether a second change to the configurable space is necessary because of the first change to the configurable space;
    means for automatically executing the second change to the configurable space by updating said digital definition; and
    a means for zones being arranged in a hierarchy wherein each zone represents a smaller portion of the vehicle, and there is at least one or more smaller zones inside a larger zone, and fully automating the arranging of interior objects while checking clearances and certification requirements for the entire interior whenever a change is made.

59. The system of claim 58, wherein said digital definition comprises a plurality of data objects representing different aspects of the configurable space, an object placing sequence including every object in the system having a zone that defines the boundaries within which it can be placed, accommodating full automation.

60. The system of claim 59, wherein a first one of said data objects contains information regarding a second data object representing an aspect of the configurable space that has a relationship with an aspect of the configurable space represented by said first data object.

61. The system of claim 60, wherein said means for determining is capable of modifying said second data object in response to a change made by the system to said first data object, and said means for determining uses said information regarding said second data object to determine whether said second data object should be modified.

62. The system of claim 59, wherein each of said data objects has one of a plurality of types, and a first of said types represents a first portion of the configurable space that is fully contained within a second portion of the configurable space represented by a second of said types.

63. The system of claim 62, wherein said means for determining is capable of responding to a change to a data object having said first type and said means for determining is capable of responding to a change to a data object having said second type.

64. The system of claim 58, further comprising a means for exporting a portion of the contents of said digital definition in a format that can be used by a means for displaying different from said means for displaying of said system.

65. The system of claim 58, further comprising a means for determining the maximum number of seats that can fit in a section of the configurable space, based on said parameters and the location of other objects in the configurable space.

66. The system of claim 58, further comprising a means for determining a course of action that, if taken, will allow the addition of one extra row of seats, while maintaining compliance with said parameters.

67. A computer-readable medium having computer-executable instructions for performing a method for designing a configurable space to accommodate objects for the configurable space for manufacture of a vehicle, said method comprising the steps of:

storing a digital definition of the configurable space and parameters related to the objects;

displaying a visual model of the configurable space;

receiving user input from a user reflecting a first change to the configurable space;

automatically determining in response to the user input and said digital definition and parameters whether a second change to the configurable space is necessary because of the first change to the configurable space;

automatically executing the second change to the configurable space by updating said digital definition for manufacture of the vehicle; and arranging the digital definitions into zones and the zones being arranged in a hierarchy wherein each zone represents a smaller portion of the vehicle, and there is at least one or more smaller zones inside a larger zone, and fully automating the arranging of interior objects while checking clearances and certification requirements for the entire interior whenever a change is made, an object placing sequence including every object in the system having a zone that defines the boundaries within which it can be placed, accommodating full automation.

68. The computer-readable medium of claim 67, wherein said digital definition comprises a plurality of data objects representing different aspects of the configurable space.

69. The computer-readable medium of claim 68, wherein a first one of said data objects contains information regarding a second data object representing an aspect of the configurable space that has a relationship with an aspect of the configurable space represented by said first data object.

70. The computer-readable medium of claim 69, wherein said method further comprises the steps of modifying said second data object in response to a change made to said first data object, and using said information regarding said second data object to determine whether said second data object should be modified.

71. The computer-readable medium of claim 68, wherein each of said data objects has one of a plurality of types, and a first of said types represents a first portion of the configurable space that is fully contained within a second portion of the configurable space represented by a second of said types.

72. The computer-readable medium of claim 67, wherein said method further comprises the step of exporting a portion of said digital definition in a format that can be used by a computer-aided design system, and further comprising an object placing sequence including every object in the system having a zone that defines the boundaries within which it can be placed, accommodating full automation.

73. The computer-readable medium of claim 67, wherein said method further comprises the step of determining the maximum number of seats that can fit in a section of the configurable space, based on said parameters and the location of other objects in the configurable space.

74. The computer-readable medium of claim 67, wherein said method further comprises the step of determining a course of action that, if taken, will allow the addition of one extra row of seats, while maintaining compliance with said parameters.

* * * * *